United States Patent [19]

Berke et al.

[11] 4,342,984
[45] Aug. 3, 1982

[54] HIGH SPEED DIGITAL TO ANALOG CONVERTER CIRCUIT

[75] Inventors: Herbert Berke, Maitland; John H. Allen, Winter Park, both of Fla.

[73] Assignee: The United States of America as represented by the Secretary of the Navy, Washington, D.C.

[21] Appl. No.: 213,529

[22] Filed: Dec. 5, 1980

[51] Int. Cl.³ .............................................. H03K 13/02
[52] U.S. Cl. ............................... 340/347 DA; 340/802
[58] Field of Search ............. 340/802, 347 DA; 35/12; 364/200, 900

[56] References Cited

U.S. PATENT DOCUMENTS 3,877,023 4/1975 Spicer ........................... 340/347 DA
4,016,555 4/1977 Tyrrel ........................... 340/347 DA Primary Examiner—Charles D. Miller Attorney, Agent, or Firm—Robert F. Beers; Robert W. Adams; David S. Kalmbaugh

[57] ABSTRACT

A high speed digital to analog converter circuit for converting a plurality of data bytes to corresponding analog signals at very high conversion rates. A computer image generator provides in response to each clock pulse of a first clock signal a set of eight data bytes. Each set of data bytes are then latched alternatively in first storage means or second storage means. Multiplexing means alternatively samples each set of data bytes latched in said first and second storage means, and an octet of digital to analog converters then converts each set of data bytes to a corresponding set of eight analog signals. Gating means, in turn, sequentially passes each set of analog signals so as to form at its output a video information signal which may be utilized to activate an image display apparatus.

12 Claims, 2 Drawing Figures

HIGH SPEED DIGITAL TO ANALOG CONVERTER CIRCUIT

BACKGROUND OF THE INVENTION

1. Field of the Invention

This invention relates generally to converter circuits. In particular, this invention relates to a digital to analog converter circuit for converting a plurality of data bytes to corresponding analog signals at very high conversion rates.

2. Description of the Prior Art

Digital to analog converters of the general type provided for by the present invention are essential components of any system wherein digital signals are utilized to control the operation of various electrical and mechanical devices. In a particular situation, for example, the present invention may be utilized in combination with a computer image generator for translating the digital signals produced thereby into analog signals, which are then supplied to a image display apparatus. The image display apparatus, in turn, broadcast upon a reflective display screen a visual image to be observed by a trainee pilot.

Several types of electronic digital to analog converters have been utilized in prior systems. In one type of converter the entire range of digital signals and corresponding analog equivalents are continuously produced and compared with the digital signal to be converted. When the digital signal is found which corresponds to the digital signal to be converted, the corresponding analog signal is gated to an output circuit for utilization thereby.

In another type of digital to analog converter the number to be converted is initially entered into a register comprising a plurality of flip-flops, one for each digit of the number. The flip-flops are utilized to control a decoding network which produces an analog output signal corresponding to the setting of the register.

While performing satisfactorily for their intended purpose of converting digital signals to the corresponding analog equivalents, the aforementioned devices of the prior art ordinarily leave something to be desired, especially from the standpoints of accuracy, complexity of design, and conversion efficiency. In particular, the aformentioned devices of the prior art convert digital signals to their corresponding analog equivalents at rates which are too slow to allow their utilization within visual image generation systems such as that illustrated in a United States Patent Application entitled Pilot Helmet Mounted GIG Display with Eye Coupled Area of Interest, Ser. No. 104,521, by James F. Harvey, Walter S. Chambers, and John J. Kulik.

SUMMARY OF THE INVENTION

The subject invention overcomes some of the difficulties of the prior art including those mentioned above, in that it comprises a relatively simple digital to analog converter for converting eight bit digital words or data bytes to equivalent analog signals at extremely fast rates.

Included in the subject invention is a variable frequency clock for generating a master clock signal, and a counter for providing first, second, and third clock signals in response to the aforementioned master clock signal.

A computer image generator produces, in response to each clock pulse of the first clock signal provided by the counter, a set of eight data bytes. Each set of eight data bytes is then latched alternatively in first storage means in response to the second clock signal provided by the counter, or second storage means in response to the third clock signal provided by the counter. Multiplexing means alternatively samples each set of data bytes latched in the first and second storage means, and then passes therethrough to an octet of digital to analog converters the data bytes sampled thereby. Each digital to analog converter, in turn, converts one of the aforementioned data bytes to a corresponding analog signal. Gating means then passes therethrough, in a predetermined sequence, each analog signal so as to form at the output thereof a video information signal, which may be utilized to activate an image display apparatus.

DESCRIPTION OF THE PREFERRED EMBODIMENT

Figure 1:
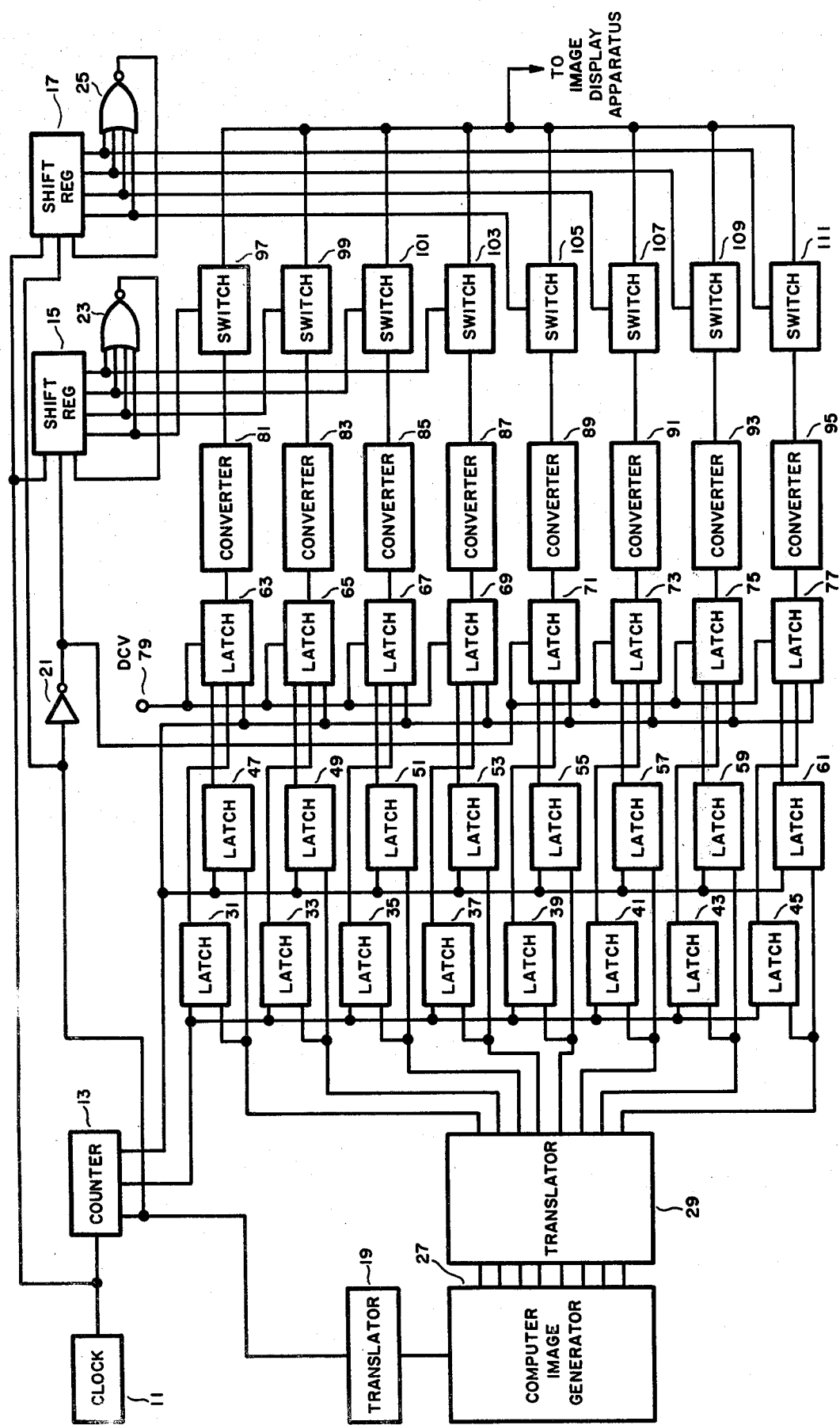
FIG. 1 is an electrical schematic diagram of the high speed digital to analog converter constituting the subject invention.

The preferred embodiment of the subject invention will now be discussed in some detail in conjunction with all of the figures of the drawing wherein like parts are designated by like reference numerals, insofar as it is possible and practical to do so.

Referring now to FIG. 1, the invention is shown as comprising an adjustable frequency master clock 11 which may be operated at any frequency between forty megahertz and two hundred megahertz that is appropriate for the invention's intended use. Nevertheless, for the image generation system for which the subject invention was designed to be compatible with, the preferred operational frequency is forty megahertz, as will be explained more fully below.

The output of clock 11 is connected to the clock input of a counter 13, the clock input of a shift register 15, and the clock input of a shift register 17. The first output of counter 13 is, in turn, connected to the input of a translator 19, the reset input of shift register 17, and the input of an inverter 21, the output of which is connected to the reset input of shift register 15.

Shift register 15 has four outputs which are respectively connected to the four inputs of a NOR gate 23, with the output thereof connected to the data input of shift register 15. Likewise, shift register 17 has four outputs which are respectively connected to the four inputs of a NOR gate 25, the output of which is connected to the data input of shift register 17.

The output of translator 19 is connected to the ready input of a computer image generator 27, the eight data terminal outputs of which are respectively connected to the eight data terminal inputs of a translator 29.

At this time, it may be noteworthy to mention that computer image generator 27 may be a Comp-U-Scene Computer Image Generation System manufactured by General Electric, Inc. In addition, it may be noted that the Comp-U-Scene Computer Image Generation System generates a data byte, or an eight bit digital word every twenty five nanoseconds. This, in turn, requires that variable frequency master clock 11 be preset to operate at a frequency of forty megahertz so as to allow for the processing of the aforementioned data bytes by the subject invention as will be discussed more fully below.

Also, it may be noteworthy to mention that each data output terminal of the components of the subject invention has eight data bit outputs, and each data input terminal of the components of the subject invention has eight data bit inputs so as to allow for the transfer of the eight bit digital words generated by computer image generator 27 between the various components of the subject invention.

Translator 29 has eight data terminal outputs which are respectively connected to the data terminal inputs of storage latches 31, 33, 35, 37, 39, 41, 43, and 45. In addition, the data terminal outputs of translator 29 are respectively connected to the data terminal inputs of storage latches 47, 49, 51, 53, 55, 57, 59, and 61.

The second output of counter 13 is connected to the clock inputs of storage latches 31 through 45, while the third output of counter 13 is connected to the clock inputs of storage latches 47 through 61. The data terminal outputs of storage latches 31 through 45 are respectively connected to the first data terminal inputs of multiplexing latches 63, 65, 67, 69, 71, 73, 75, and 77. Similarly, the data terminal outputs of storage latches 47 through 61 are respectively connected to the second data terminal inputs of multiplexing latches 63 through 77.

The third output of counter 13 is connected to the select inputs of multiplexing latches 63 through 77. The output of a direct current voltage source 79 is connected to the clock inputs of latches 63, 65, 67, and 69, while the output of inverter 21 is connected to the clock inputs of latches 71, 73, 75, and 77.

The data terminal outputs of latches 63 through 77 are respectively connected to the data terminal inputs of digital to analog converters 81, 83, 85, 87, 89, 91, 93, and 95, the outputs of which are respectively connected to the data inputs of analog switches 97, 99, 101, 103, 105, 107, 109, and 111, with the outputs thereof connected to the input of an image display apparatus, not shown. In addition, the four outputs of shift register 15 are respectively connected to the control inputs of analog switches 97, 99, 101, and 103, while the four outputs of shift register 17 are respectively connected to the control inputs of analog switches 105, 107, 109, and 111.

At this time, it may be noteworthy to mention that the components utilized in the subject invention have very high switching speeds. This, in turn, allows for the rapid processing of the digital words provided by computer image generator 27. In particular, it has been found that components listed in Table I perform quite satisfactorily in the preferred embodiment of the subject invention.

TABLE I

| Ref. No. | Description | Part Number and Mfr. | |
|---|---|---|---|
| 11 | Clock | MC 1658 | Motorola |
| 13 | Counter | MC 1654 | Motorola |
| 15, 17 | Shift Register | MC 1694 | Motorola |
| 19 | Translator | MC 10125 | Motorola |
| 21 | Inverter | MC 1660 | Motorola |
| 23, 25 | NOR gate | MC 1660 | Motorola |
| 29 | Translator | MC 10124 | Motorola |
| 31 thru 61 | Storage Latch | MC 10168 | Motorola |
| 63 thru 77 | Multiplexing Latch | MC 10173 | Motorola |
| 81 thru 95 | Digital to Analog Converter | MC 10318 | Motorola |
| 97 thru 111 | Analog Switch | GAT1 | Plessey |

The operation of the subject invention will now be discussed in conjunction with all of the figures of the drawing.

Figure 2:
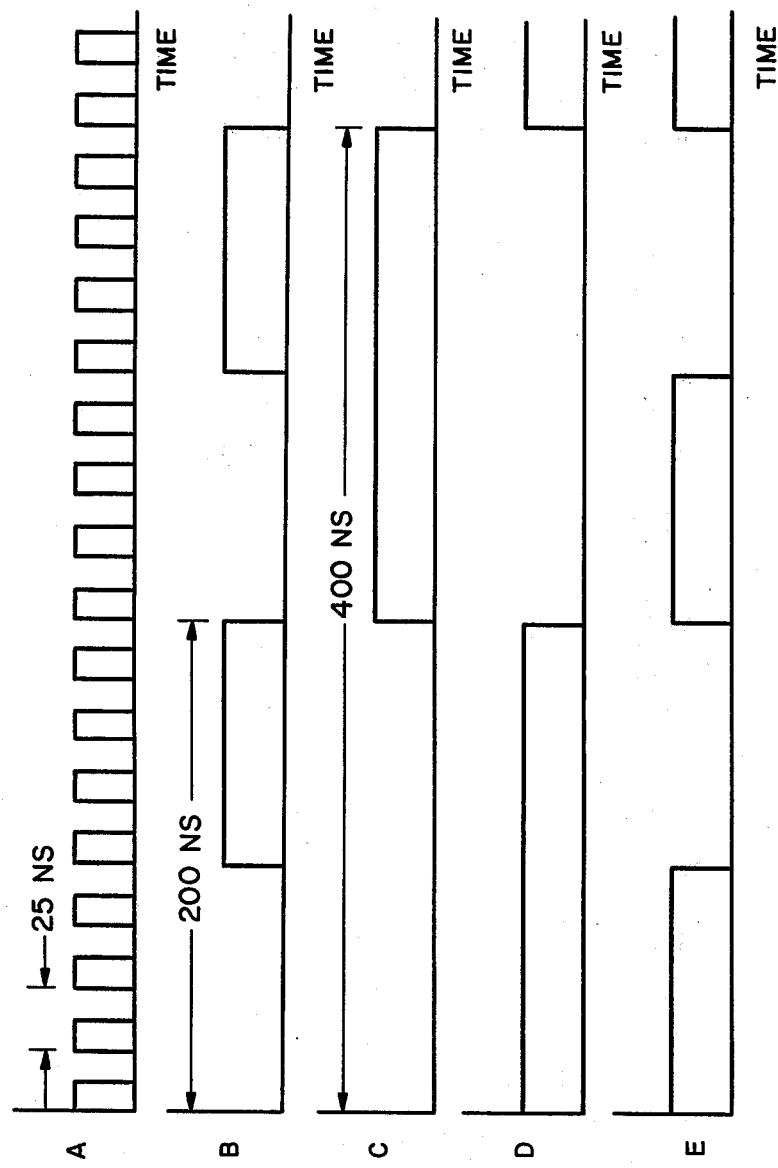
FIG. 2 is a graphical representation of various and sundry pulses which occur at the outputs of some of the elements of FIG. 1.

Referring now to FIG. 1, variable frequency master clock 11 produces a clock signal having a frequency of forty megahertz at the output thereof which is similar to that illustrated in FIG. 2(A).

The clock signal of FIG. 2(A) is then supplied to the clock input of counter 13 which divides the frequency thereof by four so as to provide at the first output thereof a clock signal similar to that depicted in FIG. 2(B). In addition, counter 13 divides the frequency of the clock signal of FIG. 2(A) by eight so as to provide at the second output thereof a clock signal similar to that shown in FIG. 2(C), and then inverts the clock signal of FIG. 2(C) so as to provide at the third output thereof a clock signal similar to that illustrated in FIG. 2(D).

The clock signal of FIG. 2(B) is supplied to the input of translator 19 which level shifts the voltage thereof such that the clock signal of FIG. 2(B) may be supplied to the ready input of computer image generator 27.

In response to each clock pulse of the clock signal of FIG. 2(B), computer image generator 27 provides at each data terminal output thereof an eight bit digital word or data byte. As mentioned above, computer image generator 27 generates a digital word every twenty five nanoseconds, thus computer image generator 27 requires two hundred nanoseconds to generate a digital word at each of the eight data terminal outputs thereof. This, in turn, requires that master clock 11 be preset at the aforementioned frequency of forty megahertz so as to allow for the processing by the subject invention of the digital words provided by computer image generator 27.

The eight digital words provided at the data terminal outputs of computer image generator 27, in response to each clock pulse of the signal of FIG. 2(B), pass through translator, 27, which level shifts the voltages thereof, to the compatible data terminal inputs of latches 31 through 61. Thus, the digital word which appears at the first data terminal output of computer image generator 27 is supplied to the data terminal inputs of latches 31 and 47, the digital word which appears at the second data terminal output of computer image generator 27 is supplied to the data terminal inputs of latches 33 and 49, and the digital word which appears at the third data terminal output of computer image generator 27 is supplied to the data terminal inputs of latches 35 and 51. Similarly, the digital word which appears at the fourth data terminal output of computer image generator 27 is supplied to the data terminal inputs of latches 37 and 53, the digital word which appears at the fifth data terminal output of computer image generator 27 is supplied to the data terminal inputs of latches 39 and 55, and the digital word which appears at the sixth data terminal output of computer image generator 27 is supplied to the data terminal inputs of latches 41 and 57. Likewise, the digital word which appears at the seventh data terminal output of computer image generator 27 is supplied to the data terminal inputs of latches 43 and 59, and the digital word which appears at the eighth data terminal output of computer image generator 27 is supplied to the data terminal inputs of latches 45 and 61.

The clock signal of FIG. 2(C), from the second output of counter 13, is supplied to the clock inputs of latches 31 through 45 such that when the clock signal of FIG. 2(C) is in the logic "1" state, the digital words which appear at the data terminal inputs of latches 31 through 45 will pass therethrough to the data terminal outputs thereof. When the clock signal of FIG. 2(C) changes from the logic "1" state to the logic "0" state, latches 31 through 45 will latch therein the aforementioned digital words so as to allow for the sampling thereof by latches 63 through 77 as will be discussed more fully below.

Likewise, the clock signal of FIG. 2(D), from the third output of counter 13, is supplied to the clock inputs of latches 47 through 61 such that when the clock signal of FIG. 2(D) is in the logic "1" state, the digital words which appear at the data terminal inputs of latches 47 through 61 will pass therethrough to the data terminal outputs thereof. When the clock signal of FIG. 2(D) changes from the logic "1" state to the logic "0" state, latches 47 through 61 will latch therein the aforementioned digital words so as to allow for the sampling thereof by latches 63 through 77 as will be discussed more fully below.

The clock signal of FIG. 2(B) from the first output of counter 13 is supplied to the input of inverter 21 so as to invert the clock signal of FIG. 2(B), thereby providing at the output thereof a clock signal similar to that depicted in FIG. 2(E). The clock signal of FIG. 2(E), is then supplied to the clock inputs of latches 71 through 77. Direct current voltage 79 supplies to the clock inputs of latches 63 through 69 a negative direct current voltage such that the signal which appears at the clock inputs of the aforementioned latches 63 through 69 is in a logic "0" state. In addition, the clock signal of FIG. 2(D) is supplied to the select inputs of latches 63 through 77.

It may be noted at this time that whenever the select inputs of latches 63 through 77 are in the logic "1" state, the first data terminal inputs thereof are enabled so as to allow for the sampling thereby of the data words latched within latches 31 through 45, and that whenever the select inputs of latches 63 through 77 are in the logic "0" state, the second data terminal inputs thereof are enabled so as to allow for the sampling thereby of the data words latched within latches 47 through 61. In addition, it may be noted that whenever the clock inputs of latches 63 through 77 are in the logic "0" state, the digital words which appear at the first and second data terminal inputs thereof will pass therethrough, and that whenever the clock inputs of latches 63 through 77 change from the logic "0" state to the logic "1" state, the digital words which appear at the first and second data terminal inputs thereof will be latched therein.

As mentioned above, when the clock signal of FIG. 2(C) changes from a logic "1" state to a logic "0" state, latches 31 through 45 will latch therein the digital words supplied to the data terminal inputs thereof by computer image generator 27. Latches 63 through 77 will then sample for a time period of two hundred nanoseconds the digital words latched within latches 31 through 45, since the clock signal of FIG. 2(D) is in the logic "1" state, thereby enabling the first data terminal inputs of the aforementioned latches 63 through 77. The digital words sampled by latches 63, 65, 67 and 69 are passed therethrough to the compatible inputs of digital to analog converters 81, 83, 85, and 87, since the clock input of each latch 63, 65, 67, and 69 is in the logic "0" state. Digital to analog converters 81, 83, 85, and 87 will, in turn, convert the digital words, which appear at the inputs thereof for two hundred nanoseconds, to corresponding analog signals. The aforementioned analog signals are then supplied to the compatible data inputs of switches 97, 99, 101, and 103, and remain at the inputs thereof for two hundred nanoseconds.

The digital words sampled by latches 71, 73, 75, and 77 are passed therethrough to the outputs thereof for two hundred nanoseconds, and then latched therein for an additional two hundred nanoseconds, since the clock signal of FIG. 2(E), which is supplied to the clock inputs thereof, changes from a logic "0" state to a logic "1" state. Digital to analog converters 89, 91, 93, and 95 will, in turn, convert the digital words, which appear at the inputs thereof for four hundred nanoseconds, to corresponding analog signals. The aforementioned analog signals are then supplied to the compatible data inputs of switches 105, 107, 109, 111, and remain at the inputs thereof for four hundred seconds.

As discussed previously, when the clock signal of FIG. 2(D) changes from a logic "1" state to a logic "0" state, latches 47 through 61 will latch therein the digital words supplied to the data terminal inputs thereof by computer image generator 27. Latches 63 through 77 will then sample for a time period of two hundred nanoseconds the digital words latched within latches 47 through 61 since the clock signal of FIG. 2(D) is in the logic "0" state, thereby enabling the second data terminal inputs of the aforementioned latches 63 through 77.

The digital words sampled by latches 63 through 69 are passed therethrough to the compatible inputs of digital to analog converters 81, 83, 85, and 87, which converts the digital words to corresponding analog signals. The aforementioned analog signals are then supplied to the compatible data inputs of switches 97, 99, 101, and 103, and remain at the inputs thereof for two hundred nanoseconds.

The digital words sampled by latches 71, 73, 75, and 77 are passed therethrough to the outputs thereof for two hundred nanoseconds, and then latched therein for an additional two hundred nanoseconds. Digital to analog converters 89, 91, 93, and 95 will convert the digital words to corresponding analog signals, which are then supplied to the compatible data inputs of switches 97, 99, 101, and 103, and remain at the inputs thereof for four hundred nanoseconds.

For the sake of clarity in discussing the operation of this portion of the subject invention, it may be assumed that the first, second, third and fourth outputs of shift register 15, and that the first, second, third, and fourth outputs of shift register 17 are initially in a logic "0" state. Thus, the output of NOR gate 23 will be in a logic "1" state, thereby presenting to the data input of shift register 15 a data bit having a logic "1" state. Likewise, the output of NOR gate 25 will be in a logic "1" state, thereby presenting to the data input of shift register 25 a data bit having a logic "1" state. In addition, it may be noted that whenever the reset inputs of shift registers 15 and 17 are in the logic "1" states, the clock inputs thereof will be inhibited such that a data bit supplied to the data inputs thereof will not pass therethrough. This, in turn, results in the outputs of shift registers 15 and 17 remaining in the logic "0" state.

When the signal of FIG. 2(B) is in the logic "1" state so as to inhibit the clock input of shift register 17, and the signal of FIG. 2(E) is in the logic "0" state, a first clock pulse of the clock signal of FIG. 2(A), supplied to the clock input of shift register 15, shifts the data bit appearing at the data input thereof to the first output thereof. This, in turn, changes the output of NOR gate 23 from a logic "1" state to a logic "0" state, thereby presenting to the data input of shift register 15 a logic "0" state. In addition, the aforementioned data bit, which appears at the first output of shift register 15, activates switch 97 so as to allow an analog signal from converter 81 to pass therethrough to the output thereof.

Similarly, a second clock pulse of the clock signal of FIG. 2(A) shifts the data bit from the first to the second output of shift register 15 so as to activate switch 99 thereby allowing an analog signal from converter 83 to pass through switch 99 to the output thereof.

Likewise, a third clock pulse of the clock signal of FIG. 2(A) shifts the data bit from the second to the third output of shift register 15 so as to activate switch 101 thereby allowing an analog signal from converter 85 to pass through switch 101 to the output thereof.

A fourth clock pulse of the clock signal of FIG. 2(A) shifts the data bit from the third output to the fourth output of shift register 15 so as to activate switch 103 thereby allowing an analog signal from converter 87 to pass through switch 103 to the output thereof.

When the signal of FIG. 2(E) is in the logic "1" state so as to inhibit the clock input of shift register 15 and the clock signal of FIG. 2(B) is in the logic "0" state, a fifth clock pulse of the clock signal of FIG. 2(A) supplied to the clock input of shift register 17, shifts the data bit appearing at the data input thereof to the first output thereof. This, in turn, changes the output of NOR gate 25 from a logic "1" state to a logic "0" state, thereby presenting to the data input of shift register 17 a logic "0" state. In addition, the aforementioned data bit, which appears at the first output of shift register 17, activates analog switch 105 so as to allow an analog signal from converter 89 to pass therethrough to the output thereof.

Similarly, a sixth clock pulse of the clock signal of FIG. 2(A) shifts the data bit from the first to the second output of shift register 17 so as to activate switch 107 thereby allowing an analog signal from converter 91 to pass through switch 107 to the output thereof.

Likewise, a third clock pulse of the clock signal of FIG. 2(A) shifts the data bit from the second to the third output of shift register 17 so as to activate switch 109, thereby allowing an analog signal from converter 93 to pass through switch 109 to the output thereof.

An eighth clock pulse of the clock signal of FIG. 2(A) shifts the data bit from the third output to the fourth output of shift register 17 so as to activate switch 111 thereby allowing an analog signal provided by converter 95 to pass through switch 111 to the output thereof.

The aforementioned analog signals, sequentially passed by analog switches 97 through 111, as discussed above, so as to form a video information signal, are then supplied to the input of the aforementioned image display apparatus which broadcasts upon a reflective display screen, not shown, a visual image to be observed by a trainee pilot, not shown.

As mentioned above, master clock 11 operates at any frequency between forty megahertz and two hundred megahertz. This, in turn, allows the subject invention to be utilized with any image generation system which produces eight bit digital words or data bytes at rates varying from a data byte every twenty-five nanoseconds to a data byte every five nanoseconds.

From the foregoing, it may readily be seen that the subject invention comprises a new, unique, and exceedingly useful high speed digital to analog converter circuit which constitutes a considerable improvement over the known prior art. Obviously, many modification and variations of the present invention are possible in light of the above teachings. It is, therefore, to be understood that within the scope of the appended claims the invention may be practiced otherwise than as specifically described.

What is claimed is:

1. A high speed electronic data conversion circuit, comprising, in combination:

adjustable oscillating means having an output for generating a master clock signal having a series of clock pulses with the frequency thereof being variable over a predetermined frequency range;

counter means having a clock input connected to the output of said adjustable oscillating means, and first, second, third, and fourth outputs for generating first, second, third, and fourth clock signals, each of which has a series of clock pulses, the first of which has a frequency that is one-fourth that of said master clock signal, the second of which has a frequency that is one-fourth of said master clock signal and is 180° out of phase with the first clock signal thereof, the second of which has a frequency that is one-eighth that of said master clock signal, and the fourth of which has a frequency that is one-eighth that of said master clock signal and is 180° out of phase with the third clock signal thereof;

image generating means having a ready input effectively connected to the first output of said counter means and eight data outputs for producing, in response to each clock pulse of said first clock signal, a set of eight data bytes, first storage means having eight data inputs effectively and respectively connected to the data outputs of said image generating means, a clock input connected to the third output of said counter means, and eight data outputs for latching therein, in response to each clock pulse of said third clock signal, one of the sets of data bytes produced by said image generating means;

second storage means having eight data inputs respectively connected to the data outputs of said image generating means, a clock input connected to the fourth output of said counter means, and eight data outputs for latching therein, in response to each clock pulse of said four clock signal, another of the sets of data bytes produced by said image generating means;

multiplexing means having a select input connected to the fourth output of said counter means, a clock input connected to the second output of said counter means, eight first data inputs respectively connected to the data outputs of said first storage means, eight second data inputs respectively connected to the data outputs of said second storage means, and eight data outputs adapted for alternately sampling the sets of data bytes latched in said first and second storage means in response to said fourth clock signal, and for latching therein, in respone to each clock pulse of said second clock signal, four data bytes of each set of data bytes sampled thereby;

translating means having eight data inputs respectively connected to the data outputs of said multiplexing means and eight data outputs for converting each set of eight data bytes sampled by said multiplexing means to a corresponding set of eight analog signals;

gating means having a clock input connected to the output of said adjustable oscillating means, a first reset input connected to the first output of said counter means, a second reset input connected to the second output of said counter means, eight data inputs respectively connected to the data outputs of said translating means, and an output for sequentially passing therethrough, in response to each clock pulse of said master clock signal, each analog signal of each set of analog signals converted by said translating means, with the four analog signals which correspond to the four data bytes latched within said multiplexing means being passed last in sequence thereby.

2. The high speed electronic data conversion circuit of claim 1 wherein said counter means comprises:
a counter having a clock input connected to the output of said adjustable oscillating means and an output; and
an inverter having an input connected to the output of said counter.

3. The high speed electronic data conversion circuit of claim 1 wherein each data byte comprises eight data bits.

4. The high speed electronic data conversion circuit of claim 1 wherein said first storage means comprises eight storage latches, each of which has a clock input connected to the third output of said counter means, and a data terminal input connected to one of the data outputs of said image generating means.

5. The high speed electronic data conversion circuit of claim 1 wherein said second storage means comprises eight storage latches, each of which has a clock input connected to the fourth output of said counter means, and a data terminal input connected to one of the data outputs of said image generating means.

6. The high speed electronic data conversion circuit of claim 1 wherein said multiplexing means comprises:
a direct current voltage source having an output; and
eight multiplexing latches, each one of which has a first data terminal input, a second data terminal input, a select input, and a clock input, with the first data terminal inputs thereof respectively connected to the data outputs of said first storage means, with the second data terminal inputs thereof respectively connected to the data outputs of said second storage means, with the select inputs thereof connected to the fourth output of said counter means, with the clock inputs of four of said multiplexing latches connected to the output of said direct current voltage source, and with the clock inputs of the remainder of said multiplexing latches connected to the second output of said counter means.

7. The high speed electronic data conversion circuit of claim 1 wherein said translating means comprises eight digital to analog converters, each of which has a data terminal input connected to one of the data outputs of said multiplexing means.

8. The high speed electronic data conversion circuit of claim 1 wherein said gating means comprises:
a first shift register having a clock input connected to the output of said adjustable oscillating means, a reset input connected to the second output of said counter means, a data input, and first, second, third, and fourth outputs;
a first NOR gate having first, second, third, and fourth inputs respectively connected to the first, second, third, and fourth outputs of said first shift register, and an output connected to the data input of said first shift register;
a second shift register having a clock input connected to the output of said adjustable oscillating means, a reset input connected to the first output of said counter means, a data input, and first, second, third, and fourth outputs;
a second NOR gate having first, second, third, and fourth inputs respectively connected to the first, second, third, and fourth outputs of said second shift register, and an output connected to the data input of said second shift register; and
an octet of analog switches, each one of which has a data input, and a control input, with the data inputs thereof respectively connected to the data outputs of said multiplexing means, with the control inputs of four of said analog switches respectively connected to the outputs of said first shift register, and with the control inputs of the remainder of said analog switches respectively connected to the outputs of said second shift register.

9. The high speed electronic data conversion circuit of claim 1 further characterized by an image display apparatus having an input connected to the output of said gating means.

10. A high speed digital to analog converter circuit comprising, in combination:
a variable frequency master clock having an output;
a counter having a clock input connected to the output of said master clock, and first, second, and third outputs;
an inverter having an input connected to the first output of said counter, and an output;
a first shift register having a clock input connected to the output of said master clock, a reset input connected to the output of said inverter, a data input, and first, second, third, and fourth outputs;
a first NOR gate having first, second, third, and fourth inputs respectively connected to the first, second, third, and fourth outputs of said first shift register, and an output connected to the data input of said first shift register;
a second shift register having a clock input connected to the output of said master clock, a reset input connected to the first output of said counter, a data input, and first, second, third and fourth outputs;
a second NOR gate having first, second, third, and fourth inputs respectively connected to the first, second, third, and fourth outputs of said second shift register, and an output connected to the data input of said second shift register;
a first translator having an input connected to the first output of said counter, and an output;
a second translator having eight data terminal inputs and eight data terminal outputs;
an octet of first storage latches, each one of which has a data terminal input, a clock input, and a data terminal output, with the data terminal inputs thereof respectively connected to the data terminal outputs of said second translator, and with the clock inputs thereof connected to the second output of said counter;
an octet of second storage latches, each one of which has a data terminal input, a clock input, and a data terminal output, with the data terminal inputs thereof respectively connected to the data terminal outputs of said translator, and with the clock inputs thereof connected to the third output of said counter;
a direct current voltage source having an output;
an octet of multiplexing latches, each one of which has a first data terminal input, a second data terminal input, a select input, and a clock input, with the first data terminal inputs thereof respectively connected to the data terminal outputs of said first storage latches, with the second data terminal inputs thereof respectively connected to the data terminal outputs of said second storage latches, with the select inputs thereof connected to the third output of said counter, with the clock inputs of four of said multiplexing latches connected to the output of said direct current voltage source, and with the clock inputs of the remainder of said multiplexing latches connected to the output of said inverter;

an octet of digital to analog converters, each one of which has a data terminal input and an output, with the data terminal inputs thereof respectively connected to the data terminal outputs of said multiplexing latches.

11. The high speed digital to analog converter circuit of claim 10 further characterized by a computer image generator having a ready input connected to the output of said first translator, and eight data terminal outputs respectively connected to the data terminal inputs of said second translator.

12. The high speed digital to analog converter circuit of claim 10 further characterized by an octet of analog switches, each one of which has a data input, and a control input, with the data inputs thereof respectively connected to the outputs of said multiplexing latches, with the control inputs of four of said analog switches respectively connected to the outputs of said first shift register, and with the control inputs of the remainder of said analog switches respectively connected to the outputs of said second shift register.

* * * * *